United States Patent
Nardin

(10) Patent No.: US 9,178,485 B2
(45) Date of Patent: Nov. 3, 2015

(54) METHODS AND SYSTEMS FOR REDUCING CONDUCTED ELECTROMAGNETIC INTERFERENCE

(71) Applicant: Regal Beloit America, Inc., Beloit, WI (US)

(72) Inventor: Steven A. Nardin, Fort Wayne, IN (US)

(73) Assignee: REGAL BELOIT AMERICA, INC., Beloit, WI (US)

( * ) Notice: Subject to any disclaimer, the term of this patent is extended or adjusted under 35 U.S.C. 154(b) by 346 days.

(21) Appl. No.: 13/787,649

(22) Filed: Mar. 6, 2013

(65) Prior Publication Data

US 2014/0252896 A1    Sep. 11, 2014

(51) Int. Cl.
*H02K 11/02* (2006.01)
*H03H 7/01* (2006.01)
*H03H 7/42* (2006.01)

(52) U.S. Cl.
CPC ............. *H03H 7/0138* (2013.01); *H02K 11/02* (2013.01); *H02K 11/024* (2013.01); *H03H 7/427* (2013.01)

(58) Field of Classification Search
CPC ... H02K 11/02; H02K 11/022; H02K 11/024; H02K 11/0068; H02K 11/0073
USPC .................................. 310/71, 68 R, 68 C, 72
See application file for complete search history.

(56) References Cited

U.S. PATENT DOCUMENTS

| | | | |
|---|---|---|---|
| 5,552,976 A | 9/1996 | Munro et al. | |
| 6,008,560 A | 12/1999 | Becerra | |
| 6,898,072 B2 | 5/2005 | Beihoff et al. | |
| 6,909,607 B2 | 6/2005 | Radosevich et al. | |
| 6,972,957 B2 | 12/2005 | Beihoff et al. | |
| 6,982,873 B2 | 1/2006 | Meyer et al. | |
| 7,032,695 B2 | 4/2006 | Beihoff et al. | |
| 7,142,434 B2 | 11/2006 | Beihoff et al. | |
| 7,276,859 B1 * | 10/2007 | Trestman et al. | 315/224 |
| 2003/0127913 A1 * | 7/2003 | Roberts et al. | 307/89 |
| 2003/0132040 A1 | 7/2003 | Radosevich et al. | |
| 2003/0133282 A1 | 7/2003 | Beihoff et al. | |

* cited by examiner

*Primary Examiner* — Michael Andrews
(74) *Attorney, Agent, or Firm* — Armstrong Teasdale LLP

(57) ABSTRACT

An EMI filter is described. The filter includes an input, an output, first and second line-side X capacitors, and a line-side Y capacitor. The input includes first and second input terminals. The output includes first and second output terminals. A first conductive path is defined between the first input terminal and the first output terminal. A second conductive path is defined between the second input terminal and the second output terminal. The first line-side X capacitor is coupled between the first conductive path and the second conductive path, and the second line-side X capacitor is coupled between the first conductive path and the second conductive path in series with the first line-side X capacitor. The second line-side X capacitor is coupled to the first line-side X capacitor at a common point. A first end of the line-side Y capacitor is coupled to the common point.

20 Claims, 3 Drawing Sheets

METHODS AND SYSTEMS FOR REDUCING CONDUCTED ELECTROMAGNETIC INTERFERENCE

BACKGROUND OF THE DISCLOSURE

The embodiments described herein relate generally to reduction of electromagnetic interference (EMI), and more specifically, to reducing conducted EMI in electronically commutated motors and switching power supplies.

At least some known electronic devices include electrical lines that produce unwanted electrical noise. Such electrical noise can adversely affect other electronic circuit components either within the electronic device itself or in nearby external electronic devices. Conducted EMI is an electrical noise current which is typically present in the radio-wave frequency range and sometimes referred to as radio frequency interference (RFI). This current originates from within a system of electrical devices rather than from an outside source such as a radio signal transmitter. Electric power supplies of electric motors are sometimes significant generators of EMI. In connection with electric power supplies, EMI is undesirable because, for example, it can disturb the operation or degrade the performance of other equipment connected to the same source of power.

In residential and industrial applications, federal regulations have required manufacturers to control conducted EMI generated by power electronic devices. To reduce EMI in electric motors, at least some manufacturers connect large, bulky EMI filters to a motor controller of the electric motor. However, as a demand for smaller, more compact electric motors increases, manufacturers are limited in EMI filter design, size, and cost.

BRIEF DESCRIPTION

In one aspect, an electromagnetic interference (EMI) filter to couple between a power source and a switching electronic device is described. The filter includes an input, an output, a first line-side X capacitor, a second line-side X capacitor, and a line-side Y capacitor. The input includes a first input terminal and a second input terminal. The output includes a first output terminal and a second output terminal. A first conductive path is defined between the first input terminal and the first output terminal, and a second conductive path is defined between the second input terminal and the second output terminal. The first line-side X capacitor is coupled between the first conductive path and the second conductive path. The second line-side X capacitor is coupled between the first conductive path and the second conductive path in series with the first line-side X capacitor. The second line-side X capacitor is coupled to the first line-side X capacitor at a common point. The line-side Y capacitor includes a first end and a second end opposite the first end. The first end of the line-side Y capacitor is coupled to the common point.

In another aspect, a wiring harness for an electric motor includes an input configured to couple to a power source, an output configured to couple to the electric motor, a first conductive path between the input and the output, a second conductive path between the input and the output, a grounding path, a first line-side X capacitor coupled between the first conductive path and the second conductive path, a second line-side X capacitor coupled between the first conductive path and the second conductive path in series with the first line-side X capacitor, and a line-side Y capacitor. The second line-side X capacitor is coupled to the first line-side X capacitor at a common point. The line-side Y capacitor includes a first end and a second end opposite the first end. The first end of the line-side Y capacitor is coupled to the common point.

In yet another aspect, an electric motor assembly includes an electric motor and an electromagnetic interference (EMI) filter. The electric motor includes a power input configured to receive electrical power to operate said electric motor. The EMI filter includes an input configured to couple to a power source, an output coupled to the electric motor power input, a first conductive path defined between the input and the output, a second conductive path defined between the input and the output, a grounding path, a first line-side X capacitor coupled between the first conductive path and the second conductive path, a second line-side X capacitor, and a line-side Y capacitor. The second line-side X capacitor is coupled between the first conductive path and the second conductive path in series with the first line-side X capacitor. The second line-side X capacitor is coupled to the first line-side X capacitor at a common point. The line-side Y capacitor includes a first end and a second end opposite the first end. The first end of the line-side Y capacitor is coupled to the common point.

DETAILED DESCRIPTION

The embodiments described herein relate generally to reduction of electromagnetic interference (EMI), and more specifically, to reducing conducted EMI in electronically commutated motors and switching power supplies. Although generally described herein with reference to a motor, the methods and systems for reducing EMI described herein may be used to reduce EMI in a variety of electrical apparatus, including for example, switching power supplies, linear power supplies, etc.

Figure 1:
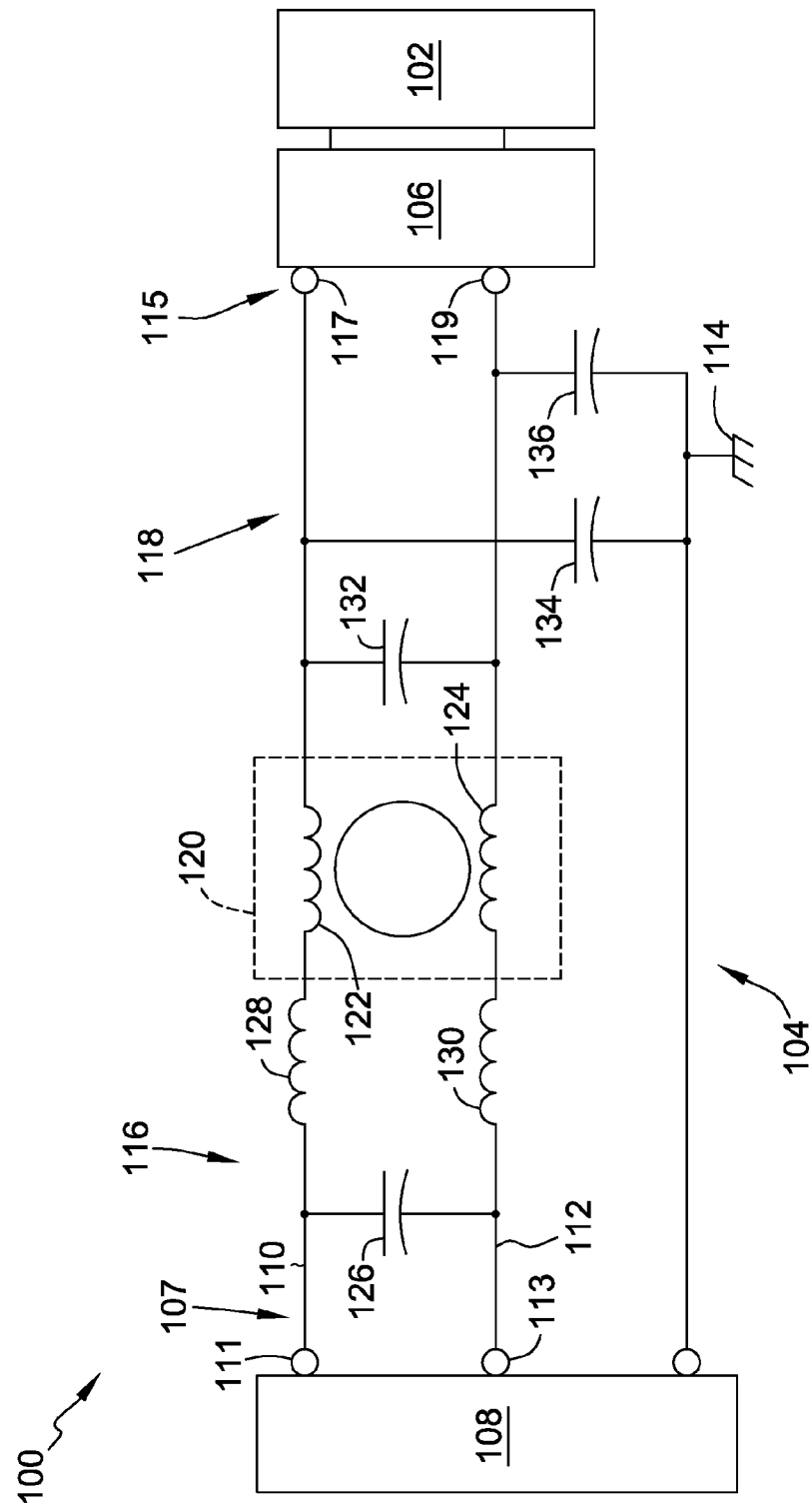
FIG. 1 is a circuit diagram of a known motor assembly that includes an electromagnetic interference (EMI) filter.

FIG. 1 is a circuit diagram of a known motor assembly 100 including an electric motor 102, an EMI filter 104, and a motor controller 106. Motor assembly 100, and more particularly EMI filter 104, is coupled at an input 107 to a power supply 108, which is a single phase alternating current (AC) power supply that inputs AC power to a first conductive path 110 and a second conductive path 112. Input 107 includes a first input terminal 111 and a second input terminal 113. Power supply 108 is also coupled to earth ground 114. Power supply 108 may produce either 120 volts root mean square (VRMS) or 240 VRMS depending on the requirements of electric motor 102.

Motor controller 106 is configured to control operation of electric motor 102 using AC power from power supply 108. Motor controller 106 may include, for example a rectifier (not shown) for rectifying or converting the AC power from power supply 108 to a direct current (DC) power usable to control the motor, and an inverter (not shown) for inverting the rectified power to three-phase power for operating electric motor 102. Some modern 240 V electric motors can operate at either on a 120 VRMS or a 240 VRMS input and include a voltage doubler for operating with a 120 VRMS input from power supply 108.

EMI filter 104 is coupled between power supply 108 and motor controller 106. EMI filter 104 includes a line side 116 coupled to power supply 108 via first and second input terminals 107 and 113, and a load side 118 coupled to motor controller 106 and motor 102 via an output 115. Output 115 includes a first output terminal 117 and a second output terminal 119. A common mode choke 120 is coupled across first and second conductive paths 110 and 112 between line side 116 and load side 118. Common mode choke 120 includes a first choke inductor 122 and a second choke inductor 124 electromagnetically coupled to first choke inductor 122. A line-side X capacitor 126, sometimes referred to as an across the line capacitor, is coupled to first conductive path 110 and second conductive path 112. A first line-side inductor 128 is coupled in first conductive path 110, and a second-line side inductor 130 is coupled in second conductive path 112. Some other embodiments do not include inductors 128 and 130. Load side 118 includes a load-side X capacitor 132 coupled across first and second conductive paths 110 and 112, a first Y capacitor 134 coupled to first conductive path 110 and ground 114, and a second Y capacitor 136 coupled to second conductive path 112 and ground 114.

Figure 2:
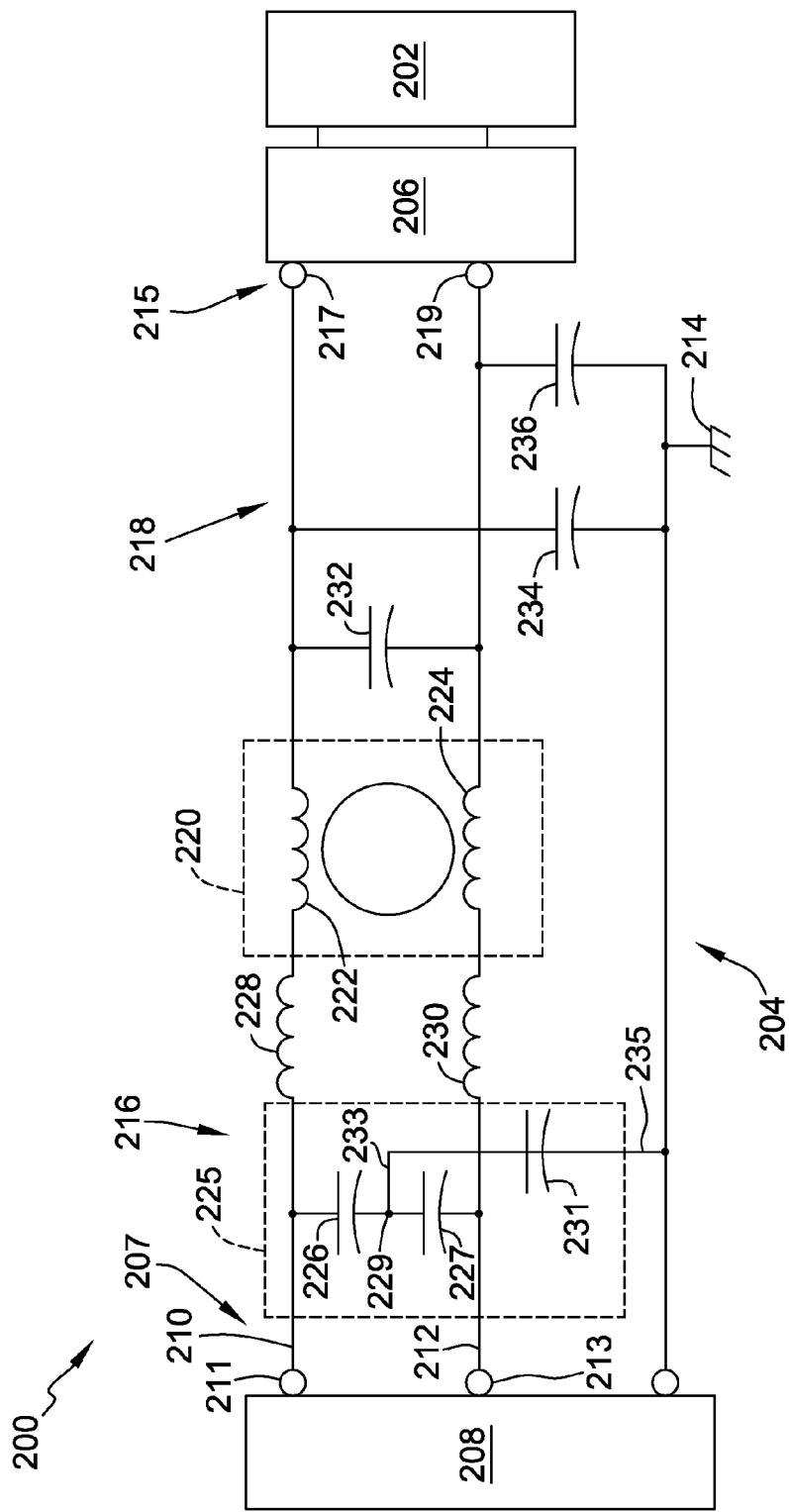
FIG. 2 a circuit diagram of an exemplary embodiment of an electric motor assembly that includes an electromagnetic interference (EMI) filter.

FIG. 2 is a circuit diagram of an exemplary embodiment of a motor assembly 200 including an electric motor 202, an EMI filter 204, and a motor controller 206. Although illustrated as separate components, motor controller motor 202, EMI filter 204, and motor controller 206 may be included within a single housing (not shown in FIG. 2). In other embodiments, electric motor 202, and motor controller 206 are housed within a single housing and EMI filter 204 is included in a wiring harness (not shown in FIG. 2) coupled to motor controller 206. The wiring harness may be an internal wiring harness or an external wiring harness. Motor 202 is an electronically commutated motor. In other embodiments, motor 202 may be any type of motor that may benefit from EMI reduction, including for example, a permanent magnet synchronous motor (PMSM), a stepper motor, a variable frequency drive, etc. In some embodiments motor 202 may be used in air moving applications used in the heating, ventilation, and air conditioning (HVAC) industry, may be used in fluid pumping applications, and/or may be used in commercial and industrial applications. In other embodiments, motor 202 may engage any suitable work component and be configured to drive such a work component.

Motor assembly 200, and more particularly EMI filter 204, is coupled at an input 207 to a power supply 208. Power supply 208 is a single phase alternating current (AC) power supply that inputs AC power to a first conductive path 210 and a second conductive path 212. In other embodiments, power supply 208 supplies more than one phase of AC power to motor assembly 200. Input 207 includes a first input terminal 211 and a second input terminal 213. Power supply 208 and EMI filter 204 are also coupled to earth ground 214. While described herein as a 120 volt AC power supply or a 240 volt AC power supply, in other embodiments, power supply 208 may be a 440 to 460 volt power supply or any other suitable power supply that enables system 200 to function as described herein.

Motor controller 206 is configured to control operation of electric motor 202 using AC power from power supply 208. Motor controller 302 provides electric motor 202 with operating signals, for example, but not limited to, a sine wave operating signal, a square wave operating signal, or any other suitable operating signal that allows system 200 to function as described herein. The operating signals direct operation of electric motor 202. Motor controller 206 may include, for example a rectifier (not shown) for rectifying or converting the AC power from power supply 208 to a direct current (DC) power usable to control the motor, and an inverter (not shown) for inverting the rectified power to three-phase power for operating electric motor 202. Motor controller 206 may also include a voltage doubler for operating a 240 VRMS motor with a 120 VRMS input from power supply 208.

EMI filter 204 is coupled between power supply 208 and motor controller 206. EMI filter 204 includes a line side 216 coupled to power supply 208 via first and second input terminals 207 and 213, and a load side 218 coupled to motor controller 206 and motor 202 via an output 215. Output 215 includes a first output terminal 217 and a second output terminal 219. A common mode choke 220 is coupled across first and second conductive paths 210 and 212 between line side 216 and load side 218. Common mode choke 220 includes a first choke inductor 222 and a second choke inductor 224 electromagnetically coupled to first choke inductor 222.

Line side 216 of EMI filter 204 includes an XY capacitor assembly 225. XY capacitor assembly 225 includes a first line-side X capacitor 226 coupled between first conductive path 210 and second conductive path 212 and a second line-side X capacitor 227 coupled between first conductive path 210 and second conductive path 212 in series with first line-side X capacitor 226. First line-side X capacitor 226 is coupled to second line-side X capacitor 227 at a common point 229. A line-side Y capacitor 231 is coupled to common point 229 and ground 214. More specifically, line-side Y capacitor 231 includes a first end 233 coupled to common point 229 and a second end 235 opposite first end 233 and coupled to ground 214.

Line side 216 of EMI filter 204 also includes first line-side inductor 228 is coupled in first conductive path 210, and a second-line side inductor 230 is coupled in second conductive path 212. Some other embodiments do not include inductors 228 and 230. Load side 218 of EMI filter 204 includes a load-side X capacitor 232 coupled across first and second conductive paths 210 and 212, a first Y capacitor 234 coupled to first conductive path 210 and ground 214, and a second Y capacitor 236 coupled to second conductive path 212 and ground 214.

Figure 3:
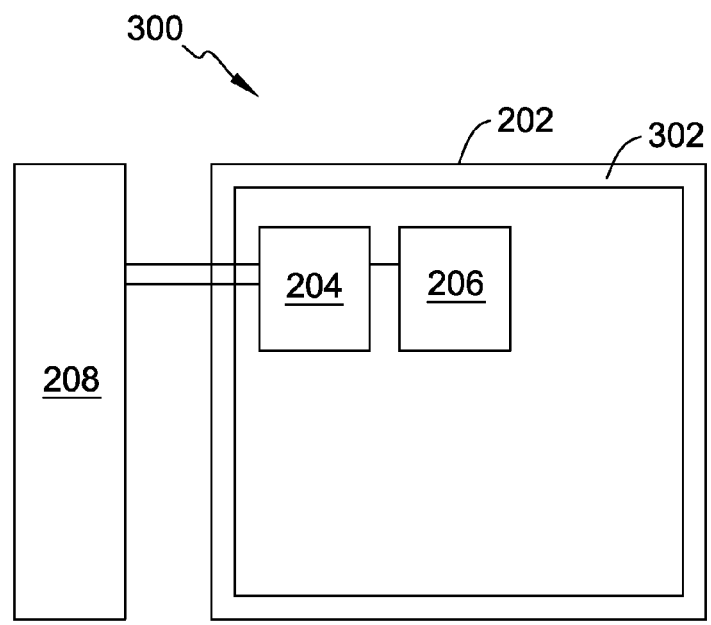
FIG. 3 is a block diagram of an exemplary configuration of an electric motor assembly that includes the EMI filter shown in FIG. 2.

FIG. 3 is an exemplary embodiment of a motor assembly 300. Motor assembly 300 includes motor 202, EMI filter 204, and motor controller 206. Motor 202 includes a housing 302. EMI filter 204 and motor controller 206 are disposed within housing 302.

Figure 4:
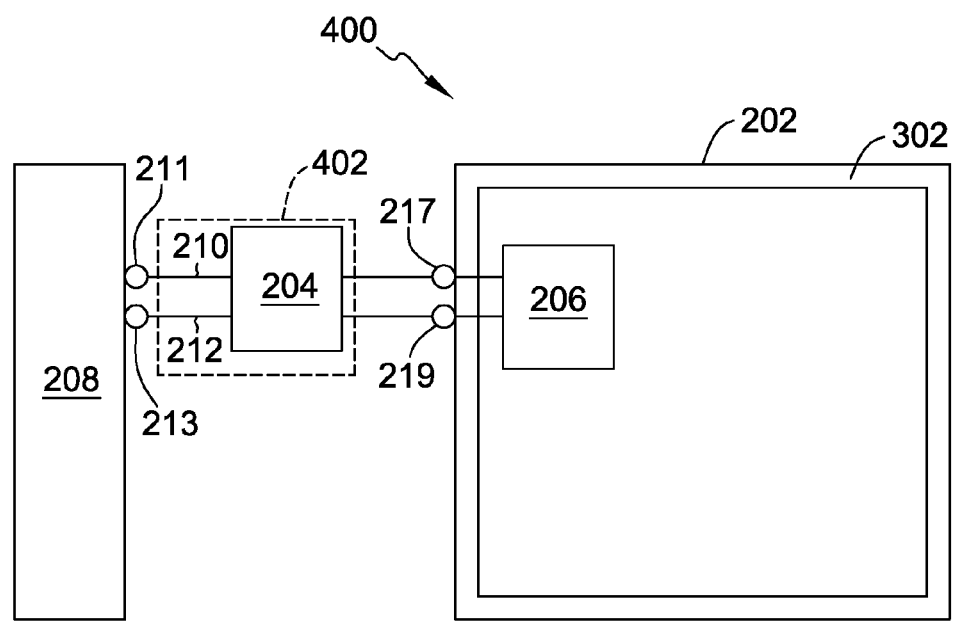
FIG. 4 is a block diagram of an exemplary configuration of another electric motor assembly that includes the EMI filter shown in FIG. 2.

FIG. 4 is an exemplary embodiment of a motor assembly 400. Motor assembly 400 includes motor 202, EMI filter 204, and motor controller 206. Motor 202 includes housing 302, and motor controller 206 is disposed within housing 302. A wiring harness 402 couples power supply 208 to motor controller 206. EMI filter 204 is disposed in wiring harness 402.

Described herein are exemplary methods, systems, and an apparatus for reducing conducted EMI. The methods, systems and apparatus may be used with any electronic device that may benefit from the reduced EMI. When used in connection with a motor, for example, EMI is reduced by positioning an XY capacitor assembly between a common mode choke and a power supply for the motor. The EMI filter and/or the XY capacitor assembly may be incorporated into the motor, i.e. within a motor housing, or incorporated within an external wiring harness. Moreover, the XY capacitor assembly and/or the EMI filter may be used with any other electronic device that tends to generate EMI. For example, the XY capacitor assembly and/or the EMI filter may be used in connection with a switching power supply or any other electronically switched device. The methods, systems, and apparatus described herein facilitate efficient and economical EMI reduction in electric motors. Exemplary embodiments of methods, systems, and apparatus are described and/or illustrated herein in detail. The methods, systems, and apparatus are not limited to the specific embodiments described herein, but rather, components of each system and/or apparatus, as well as steps of each method, may be utilized independently and separately from other components and steps described herein. Each component, and each method step, can also be used in combination with other components and/or method steps.

When introducing elements/components/etc. of the methods and apparatus described and/or illustrated herein, the articles "a", "an", "the", and "said" are intended to mean that there are one or more of the element(s)/component(s)/etc. The terms "comprising", "including", and "having" are intended to be inclusive and mean that there may be additional element(s)/component(s)/etc. other than the listed element(s)/component(s)/etc.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electromagnetic interference (EMI) filter comprising:
    an input comprising a first input terminal and a second input terminal;
    an output comprising a first output terminal and a second output terminal, wherein a first conductive path is defined between the first input terminal and the first output terminal, and a second conductive path is defined between the second input terminal and the second output terminal;
    a first line-side X capacitor coupled between the first conductive path and the second conductive path;
    a second line-side X capacitor coupled between the first conductive path and the second conductive path in series with the first line-side X capacitor, said second line-side X capacitor coupled to said first line-side X capacitor at a common point;
    a line-side Y capacitor including a first end and a second end opposite the first end, the first end of said line-side Y capacitor coupled to the common point;
    a first load-side Y capacitor including a first end and a second end opposite the first end, the first end of said first load-side Y capacitor coupled to the first conductive path between said first line-side X capacitor and said output; and
    a second load-side Y capacitor including a first end and a second end opposite the first end, the first end of said second load-side Y capacitor coupled to the second conductive path between said second line-side X capacitor and said output.

2. An EMI filter in accordance with claim 1, wherein said input further comprises a ground terminal, and the second end of said line-side Y capacitor is operatively coupled to the ground terminal, wherein the second end of said first load-side Y capacitor is operatively coupled to said ground terminal and the second end of said second load-side Y capacitor is operatively coupled said ground terminal.

3. An EMI filter in accordance with claim 2, further comprising a first inductor coupled in the first conductive path between said first line-side X capacitor and said first load-side Y capacitor, and a second inductor coupled in the second conductive path between said second line-side X capacitor and said second load-side Y capacitor.

4. An EMI filter in accordance with claim 3, wherein said first inductor and said second inductor comprise a common mode choke.

5. An EMI filter in accordance with claim 4, further comprising a load-side X capacitor coupled from the first conductive path to the second conductive path between said common mode choke and said output.

6. An EMI filter in accordance with claim 1, wherein said common point is not connected to a conductive path.

7. A wiring harness for an electric motor, said wiring harness comprising:
    an input configured to couple to a power source;
    an output configured to couple to the electric motor;
    a first conductive path between said input and said output;
    a second conductive path between said input and said output;
    a grounding path;
    a first line-side X capacitor coupled between said first conductive path and said second conductive path;
    a second line-side X capacitor coupled between said first conductive path and said second conductive path in series with said first line-side X capacitor, said second line-side X capacitor coupled to said first line-side X capacitor at a common point;
    a line-side Y capacitor including a first end and a second end opposite the first end, the first end of said line-side Y capacitor coupled to the common point;
    a first load-side Y capacitor coupled from said first conductive path to said grounding path between said first line-side X capacitor and said output; and
    a second load-side Y capacitor coupled from said second conductive path to said grounding path between said second line-side X capacitor and said output.

8. A wiring harness in accordance with claim 7, wherein the second end of said line-side Y capacitor is coupled to said grounding path.

9. A wiring harness in accordance with claim 8, further comprising a first inductor coupled in said first conductive path between said first line-side X capacitor and said first load-side Y capacitor, and a second inductor coupled in said second conductive path between said second line-side X capacitor and said second load-side Y capacitor.

10. A wiring harness in accordance with claim 9, wherein said first inductor and said second inductor comprise a common mode choke.

11. A wiring harness in accordance with claim 10, further comprising a load-side X capacitor coupled from said first conductive path to said second conductive path between said common mode choke and said output.

12. A wiring harness in accordance with claim 7, wherein said common point is not connected to a conductive path.

13. An electric motor assembly comprising:
    an electric motor including a power input configured to receive electrical power to operate said electric motor; and
    an electromagnetic interference (EMI) filter comprising:
        an input configured to couple to a power source;

an output coupled to said electric motor power input;
a first conductive path defined between said input and said output;
a second conductive path defined between said input and said output;
a grounding path;
a first line-side X capacitor coupled between said first conductive path and said second conductive path;
a second line-side X capacitor coupled between said first conductive path and said second conductive path in series with said first line-side X capacitor, said second line-side X capacitor coupled to said first line-side X capacitor at a common point;
a line-side Y capacitor including a first end and a second end opposite the first end, the first end of said line-side Y capacitor coupled to the common point;
a first load-side Y capacitor coupled from said first conductive path to said grounding path between said first line-side X capacitor and said output; and
a second load-side Y capacitor coupled from said second conductive path to said grounding path between said second line-side X capacitor and said output.

14. An electric motor assembly in accordance with claim 13, wherein the second end of said line-side Y capacitor is coupled to said grounding path.

15. An electric motor assembly in accordance with claim 14, wherein said EMI filter further comprises a first inductor coupled in said first conductive path between said first line-side X capacitor and said first load-side Y capacitor, and a second inductor coupled in said second conductive path between said second line-side X capacitor and said second load-side Y capacitor.

16. An electric motor assembly in accordance with claim 15, wherein said first inductor and said second inductor comprise a common mode choke.

17. An electric motor assembly in accordance with claim 16, wherein said EMI filter further comprises a load-side X capacitor coupled from said first conductive path to said second conductive path between said common mode choke and said output.

18. An electric motor assembly in accordance with claim 13, wherein said electric motor comprises a housing, and wherein said EMI filter is disposed within said housing.

19. An electric motor assembly in accordance with claim 13, wherein said electric motor is an electronically commutated motor configured for use in a heating, ventilation, and air conditioning (HVAC) system.

20. An electric motor assembly in accordance with claim 13, wherein said common point is not connected to a conductive path.

\* \* \* \* \*